United States Patent [19]
Okitaka

[11] Patent Number: 4,851,721
[45] Date of Patent: Jul. 25, 1989

[54] SEMICONDUCTOR INTEGRATED CIRCUIT

[75] Inventor: Takenori Okitaka, Hyogo, Japan

[73] Assignee: Mitsubishi Denki Kabushiki Kaisha, Tokyo, Japan

[21] Appl. No.: 159,854

[22] Filed: Feb. 24, 1988

[30] Foreign Application Priority Data

Feb. 24, 1987 [JP] Japan .................................. 62-41918

[51] Int. Cl.$^4$ .................. H03K 17/60; H03K 17/687; H03K 19/094; G05F 1/40
[52] U.S. Cl. .................... 307/570; 307/571; 307/576; 307/579; 307/585; 307/592; 307/597; 307/450; 307/451; 323/271; 323/272
[58] Field of Search ............... 307/571, 576, 579, 585, 307/592, 597, 603, 443, 450, 451, 475, 446; 323/271, 272

[56] References Cited

U.S. PATENT DOCUMENTS

| | | | |
|---|---|---|---|
| 3,541,353 | 11/1970 | Seelbach et al. | 307/446 |
| 3,601,630 | 6/1969 | Redwine . | |
| 3,649,843 | 3/1972 | Redwine et al. | 307/446 |
| 4,301,383 | 11/1981 | Taylor | 307/446 |
| 4,438,352 | 3/1984 | Mardkha | 307/475 |
| 4,518,873 | 5/1985 | Suzuki et al. | 307/451 |
| 4,558,234 | 12/1985 | Suzuki et al. | 307/451 |
| 4,723,082 | 2/1988 | Asano et al. | 307/451 |

FOREIGN PATENT DOCUMENTS

| | | |
|---|---|---|
| 2031048 | 1/1971 | Fed. Rep. of Germany . |
| 2304710 | 8/1973 | Fed. Rep. of Germany . |
| 1419542 | 1/1973 | United Kingdom . |

OTHER PUBLICATIONS

"Reverse Bias Over-Current Protection for Power Field-Effect Transistors", IBM Technical Disclosure Bulletin, vol. 29, No. 2, Jul. 1986.
Smith, "Die invers-parallele Diode von Leistungs-MOSFETS", Elektronik (1980).
RCA Solid-State QMOS Data Book, RCA Corporation, 1985, pp. 2 & 469.

Primary Examiner—John S. Heyman
Assistant Examiner—Trong Quang Phan
Attorney, Agent, or Firm—Lowe, Price, LeBlanc, Becker & Shur

[57] ABSTRACT

An interconnection circuit of a semiconductor integrated circuit connected between a first circuit (41) for applying an input signal and the second circuit (44) for outputting an output signal to the other circuit comprises circuits of input stage, processing stage and output stage. The circuit of the input stage comprises an n channel MOS field effect transistor (14) and a resistance (7). The circuit of the processing stage comprises two CMOS inverters (1, 2, 31, 32). The circuit of the output stage comprises a CMOS inverter (15, 16) and a series connection of a resistance (21), an npn bipolar transistor (17) and an n channel MOS filed effect transistor (18). When an overvoltage is applied to the input terminal (8), the circuit of the input stage protects the circuit by a parasitic diode (25) formed by the transistor (14) or the punch through phenomenon of the transistor (14). When the power supply $V_{cc}$ of the interconnection circuit is off, when the output of the first circuit (41) or the output of the second circuit (44) is brought to a high level voltage, no current flows into the interconnection circuit. Therefore, malfunctions of the first and second circuits can be prevented.

8 Claims, 3 Drawing Sheets

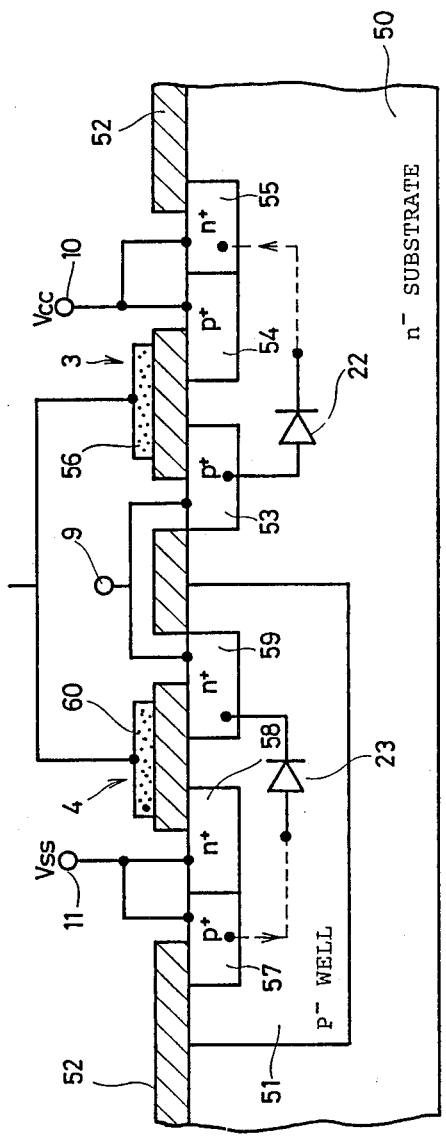

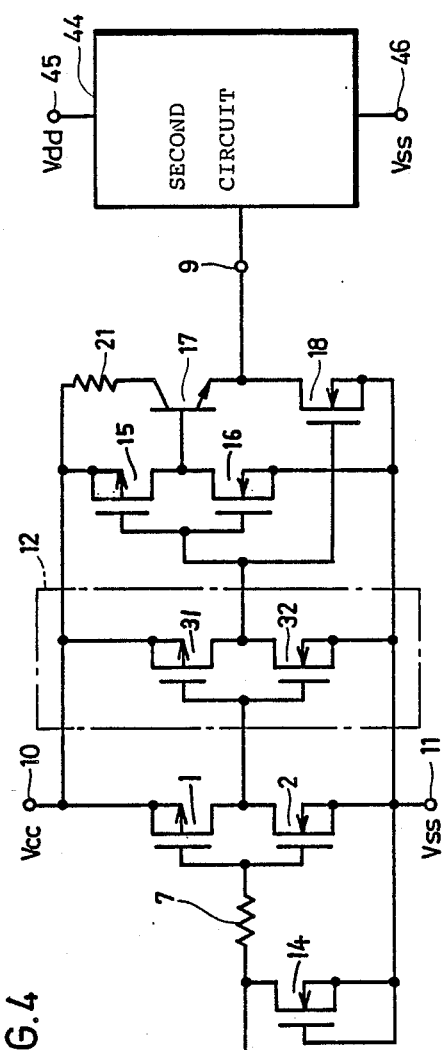

SEMICONDUCTOR INTEGRATED CIRCUIT

CROSS REFERENCE TO A RELATED COPENDING APPLICATION

A copending application of particular interest to the present application is U.S. patent application Ser. No. 132,648 entitled "Input Protecting Device for a Semiconductor Circuit Device" filed on Dec. 8, 1987.

BACKGROUND OF THE INVENTION

Field of the Invention

The present invention relates to a semiconductor integrated circuit and, more particularly, it relates to an interconnection circuit connected between two circuits.

FIG. 1 is a schematic diagram showing one example of a conventional interconnection circuit of a semiconductor integrated circuit for connecting two circuits.

Referring to FIG. 1, the interconnection circuit is connected between a first circuit 41 for applying an input signal and a second circuit 44 for outputting an output signal to the other circuit. An input terminal 8 and an output terminal 9 of the interconnection circuit are respectively connected to an output of the first circuit 41 and an output of the second circuit 44. The interconnection circuit comprises a parallel connection of four series circuits connected between the power supply $V_{cc}$ and the ground $V_{ss}$. Although this interconnection circuit comprises an inverter as one example of an inner circuit 12, any logic circuit such as a flip-flop circuit or a latch circuit may be applied as another example of the inner circuit 12. The first series circuit comprises a series connection of junction diodes 5 and 6. The node of the diodes 5 and 6 is connected to the input terminal 8. The second series circuit comprises a series connection of a p channel MOS (Metal Oxide Semiconductor) field effect transistor 1 and an n channel MOS field effect transistor 2, namely, the first CMOS (Complementary MOS) inverter. The gates of the transistors 1 and 2 are connected together and a resistance 7 is connected between the node and the input terminal 8. The first and second series circuits constitute a preceding stage. The third series circuit comprises the inner circuit 12. The inner circuit 12 comprises a series connection of a p channel MOS field effect transistor 31 and an n channel MOS field effect transistor 32, namely, the second CMOS inverter. The gates of the transistors 31 and 32 are connected together to an output of the inverter of the preceding stage. The fourth series circuit comprises a series connection of a p channel MOS field effect transistor 3 and an n channel MOS field effect transistor 4, namely, the third CMOS inverter. The gates of the transistors 3 and 4 are connected together to an output of the inverter in the inner circuit 12. The output of this inverter constitutes an output terminal 9. The supply terminal 42 of the first circuit 41 is connected to a power supply $V_{dd}$ which is different from the power supply $V_{cc}$ and the ground terminal 43 is connected to the ground $V_{ss}$. The supply terminal 45 of the second circuit 44 is connected to the power supply $V_{dd}$ and the ground terminal 46 is connected to the ground $V_{ss}$. Therefore, the first and second circuits 41 and 44 operate even when the power supply $V_{cc}$ is off.

In the normal operation, an input signal applied from the first circuit 41 is applied to the input of the first inverter via the resistance 7. The input signal is inverted by the first, second and third inverters and the inverted input signal is outputted from the output terminal 9 as an output signal.

In general, the gate of the MOS field effect transistor is insulated from other portions by a dielectric such as $SiO_2$ layer between the gate and a substrate. When a very high voltage is applied to the gate, the $SiO_2$ layer is broken down by the high voltage and the transistor is destroyed. The break down voltage, which is determined dependent on the thickness of the $SiO_2$ layer, is several ten volts in general. In order to prevent the break down of the $SiO_2$ layer caused by the high voltage applied to the gate, usually an input protection circuit for protecting the MOS field effect transistor is provided.

The diodes 5 and 6 and the resistance 7 prevent the transistors 1 and 2 from being destroyed by the overvoltage, when an overvoltage is applied to the input terminal 8. In the following description, the voltage value of the power supply $V_{cc}$ is denoted by $V_{cc}$, the voltage value of the ground $V_{ss}$ is denoted by $V_{ss}$ and the threshold voltage of the diodes 5 and 6 is denoted by $V_f$.

When an overvoltage higher than $V_{cc}+V_f$ is applied to the input terminal 8, the diode 5 conducts and clamps the input terminal 8 at the voltage of $V_{cc}+V_f$. Meanwhile, when an overvoltage lower than $V_{ss}-V_f$ is applied to the input terminal 8, the diode 6 conducts and clamps the input terminal 8 at the voltage of $V_{ss}-V_f$. Therefore, when an overvoltage is applied to the input terminal 8, the diodes 5 and 6 bring the input terminal 8 to the voltage value of $V_{cc}+V_f$ or to the value of $V_{ss}-V_f$, thereby preventing the destruction of the transistors 1 and 2 by the overvoltage.

The resistance 7 prevents the destruction of the transistors 1 and 2 by the overvoltage until the diode 5 or 6 conducts in response to the overvoltage applied to the input terminal 8. Namely, the resistance 7 is coupled together with a parasitic capacitance formed by the diodes 5 and 6 between one terminal of the resistance 7 and the power supply $V_{cc}$ or the ground $V_{ss}$ and with a parasitic capacitance formed by the transistors 1 and 2 between the other terminal of the resistance 7 and the power supply $V_{ss}$ or the ground $V_{ss}$, thereby constituting a delay circuit. Therefore, when an overvoltage is applied to the input terminal 8, the delay circuit prevents the overvoltage from being immediately applied to the gates of the transistors 1 and 2. The diodes 5 and 6 conduct before the overvoltage reaches the gates of the transistors 1 and 2 and let the overvoltage go off through the diodes 5 or 6, so that the transistors 1 and 2 are protected from the destruction by the overvoltage.

FIG. 2 shows an equivalent circuit of the interconnection circuit shown in FIG. 1.

Compared with the circuit shown in FIG. 1, the equivalent circuit of FIG. 2 comprises parasitic diodes 22 and 23 which are equivalently connected in parallel to the transistors 3 and 4, respectively. The diodes 22 and 23 are formed due to the structure of the MOS field effect transistors 3 and 4.

FIG. 3 is a cross sectional view showing a model structure of an inverter including the MOS field effect transistors 3 and 4.

Referring to FIG. 3, the p type MOS transistor 3 comprises $p^+$ type drain 53 and source 54 in an $n^-$ type substrate 50 and a gate 56 provided on a channel between the drain 53 and the source 54 with an insulating layer 52 of $SiO_2$ interposed therebetween. The transistor 3 further comprises an n+ type region 55 for providing a substrate potential. A supply terminal 10 is connected to the source 54 and the region 55. The n type MOS transistor 4 comprises n+ type drain 59 and a source 58 in a p− type well 51 formed by diffusion in the n− type substrate 50 and a gate 60 provided on the channel between the drain 53 and a source 54 with an insulating layer 52 of $SiO_2$ interposed therebetween. The transistor 4 further comprises a p+ type region 57 for providing the substrate potential. A ground terminal 11 is connected to the source 58 and the region 57. The gate 56 of the transistor 3 and the gate 60 of the transistor 4 are connected together to the output of the inner circuit 12 of the preceding stage, and the drain 53 of the transistor 3 and the drain 59 of the transistor 4 are connected together to constitute the output terminal 9.

In the inverter including the transistors 3 and 4 shown in FIG. 3, parasitic diodes 22 and 23 are formed due to the structure thereof. The parasitic diode 22 is formed between the drain 53 of the transistor 3 and the n− type substrate 50. The illustrated diode symbol 22 and the dotted line with an arrow show the path of the current flowing from the drain 53 toward the region 55. The parasitic diode 23 is formed between the drain 59 of the transistor 4 and the p− type well 51. The illustrated diode symbol 23 and the dotted line with an arrow show the path of the current flowing from the p− type well 51 toward the drain 59.

Again referring to FIGS. 1 and 2, malfunctions of the first circuit 41 and the second circuit 44 when the power supply $V_{cc}$ of this interconnection circuit is turned off will be described.

Referring to FIG. 1, when the power supply $V_{cc}$ of the interconnection circuit is turned off, the first circuit 41 is in operation and the output thereof is brought to the high level voltage, current flows from the output of the first circuit 41 to the interconnection circuit through the diode 5. This current flow causes a malfunction of the interconnection circuit. If the diodes 5 and 6 are omitted in order to prevent this problem, there arises another problem, namely, this circuit can not be protected from the input overvoltage.

Meanwhile, referring to FIG. 2, when the power supply $V_{cc}$ of the interconnection circuit is turned off and the second circuit 44 is in operation and the output thereof is brought to the high level voltage, a current flows from the output of the second circuit 44 to the interconnection circuit through the parasitic diode 22. This brings about another problem, namely, the current flow causes the malfunction of the interconnection circuit.

As a prior art of particular interest in relation to the present invention, a gate protection circuit employing an input clamp diode is disclosed in page 469 of "RCA Solid-State QMOS Data Book" published from RCA Corporation in 1985.

SUMMARY OF THE INVENTION

Therefore, a main object of the present invention is to provide an interconnection circuit which is capable of preventing the malfunction of the interconnection circuit caused by the current flow from the first circuit connected to the input of the interconnection circuit and the malfunction of the interconnection circuit caused by the current flow from the second circuit connected to the output of the interconnection circuit when the power supply of the interconnection circuit is off.

Briefly stated, the present invention comprises ground connection means connected between the input and the ground for bringing the input to the ground level voltage when an overvoltage is applied to the input, processing means for processing the input signal applied to the input, delay means connected between the input and the processing means for applying the overvoltage applied to the input to the processing means with a delay, inverter means connected to the output of the processing means and a series connection between the power supply and the ground in which an npn type bipolar transistor and an n type first field effect transistor are connected in this order, wherein the base of the transistor is connected to the input of the inverter means, the collector of the transistor is connected to receive the supply voltage from the power supply, the emitter of the transistor and the drain of the first field effect transistor are connected together to constitute the output of the circuit, the gate of the first field effect transistor is connected to the output of the processing means and the source of the first field effect transistor is connected to the ground.

According to the present invention, the ground connection means transmits the overvoltage applied to the input to the ground, whereby the processing means is prevented from being destroyed by the overvoltage. The delay means prevents the overvoltage from being applied to the processing means from the time when the overvoltages applied to the input until the operation of the ground connection means is effected. The ground connection means operates only for the overvoltage applied to the input and there is no path of the current flowing from the input toward the power supply or toward the ground. Therefore, when the power supply of this circuit is turned off, there is no current flowing into this circuit from the first circuit connected to the input. Meanwhile, since an npn type bipolar transistor is connected between the output and the power supply, there is no path of the current flowing from the output to the power supply. Therefore, when the power supply of this circuit is turned off, there is no current flowing into this circuit from the second circuit connected to the output. Therefore, when the power supply of this circuit is turned off, inflow of the current from the first and second circuits connected to the input and to the output can be prevented, so that the malfunction of the interconnection circuit caused by the inflow of the current can be prevented.

According to the present invention, an interconnection circuit can be provided which is capable of preventing malfunction of the interconnection circuit when the power supply of the interconnection circuit is turned off.

In a preferred embodiment, the ground connection means comprises a parallel connection connected between the input and the ground of an n type second field effect transistor and diode means, wherein the drain of the second filed effect transistor is connected to the input, the source and the gate of the second field effect transistor are connected together to the ground and the diode means has such polarity that allows a current to flow from the ground toward the input.

According to the preferred embodiment, when a high level overvoltage is applied to the input, the second field effect transistor is subject to the punch through phenomenon and the overvoltage is applied to the ground, whereby the input is brought to the ground level voltage. Meanwhile, when a low level overvoltage is applied to the input, the diode means conducts and the input is brought to the ground level. Therefore, when an overvoltage is applied to the input, the destruction of the circuit by the overvoltage can be prevented by bringing the input to the ground.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a cross sectional view showing a model structure of a complementary MOS inverter of the circuit of FIG. 1;

FIG. 4 is a schematic diagram showing one example of an interconnection circuit in a semiconductor integrated circuit for connecting two circuits according to the present invention; and FIG. 5 is a schematic diagram showing an equivalent circuit of the interconnection circuit shown in FIG. 4.

DESCRIPTION OF THE PREFERRED EMBODIMENTS

FIG. 4 is a schematic diagram showing one example of an interconnection circuit in a semiconductor integrated circuit for connecting two circuits according to the present invention.

Figure 1:
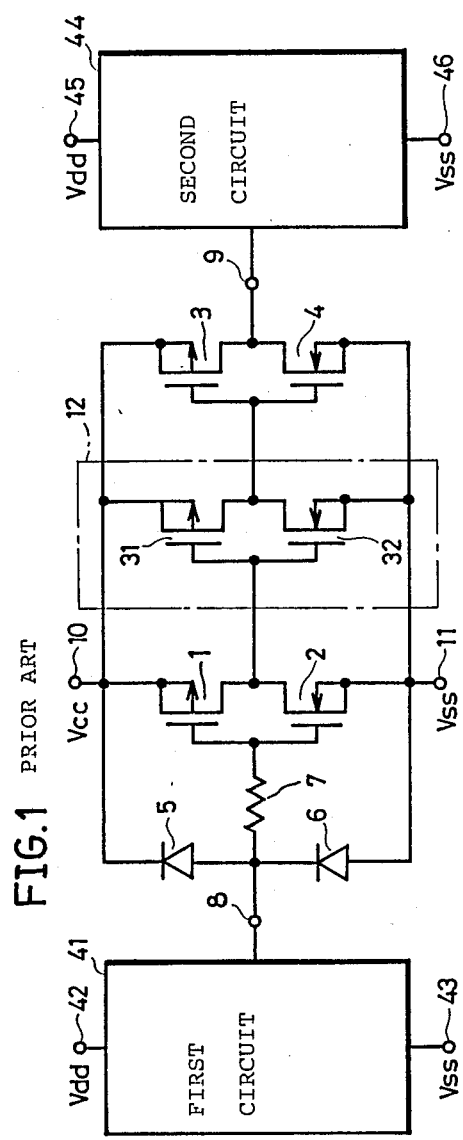
FIG. 1 is a schematic diagram showing one example of a conventional interconnection circuit in a semiconductor integrated circuit for connecting two circuits.

Referring to FIG. 4, as is the same as in the case of the circuit shown in FIG. 1, the input terminal 8 of the interconnection circuit is connected to the output of the first circuit 41 and the output terminal 9 is connected to the output of the second circuit 44. The n channel MOS field effect transistor 14 is connected between the input terminal 8 and the ground $V_{ss}$. The input terminal 8 is connected to the input of the first CMOS inverter including the p channel MOS field effect transistor 1 and the n channel MOS field effect transistor 2 through the resistance 7 between the power supply $V_{cc}$ and the ground $V_{ss}$. In the similar manner as in the case of FIG. 1, the inner circuit 12 comprises a second CMOS inverter as an example including the p channel MOS field effect transistor 31 and the n channel MOS field effect transistor 32 between the power supply $V_{cc}$ and the ground $V_{ss}$. The input of the second CMOS inverter is connected to the output of the first inverter. The input of the third CMOS inverter is connected to the output of the inner circuit 12, that is, the output of the second CMOS inverter. The third CMOS inverter comprises the p channel MOS field effect transistor 15 and the n channel MOS filed effect transistor 16 connected between the power supply $V_{cc}$ and the ground $V_{ss}$. This interconnection circuit further comprises a series connection of the resistance 21, the npn type bipolar transistor 17 and the n channel MOS field effect transistor 18 connected between the power supply $V_{cc}$ and the ground $V_{ss}$. The gate of the transistor 18 is connected to the input of the third CMOS inverter and the base of the transistor 17 is connected to the output of the third CMOS inverter. The node between the transistors 17 and 18 constitutes the output terminal 9.

The normal operation of the interconnection circuit shown in FIG. 4 will be hereinafter described.

When a high level input signal is applied from the first circuit 41 to the input terminal 8, the input signal is applied to the input of the first CMOS inverter through the resistance 7. In response to the input signal, the transistor 2 of the first CMOS inverter, the transistor 31 of the inner circuit 12 and the transistor 16 of the third CMOS inverter successively turn on. The npn bipolar transistor 17 turns off in response to the low level output signal from the third inverter and the transistor 18 turns on in response to a high level output signal from the inner circuit 12. Therefore, a low level output signal is outputted from the output terminal 9.

Meanwhile, when a low level input signal is applied to the input terminal 8, the transistor 1 of the first CMOS inverter, the transistor 32 of the inner circuit 12 and the transistor 15 of the third CMOS inverter successively turn on in response to the input signal. The npn bipolar transistor 17 turns on in response to a high level output signal from the third inverter and the transistor 18 turns off in response to a low level output signal from the inner circuit 12. Therefore, a high level output signal is outputted from the output terminal 9.

The resistance 21 brings about the balance on the characteristics of the bipolar transistor 17 and the field effect transistor 18, and the collector current of the bipolar transistor 17 is limited by the resistance 21. Since the balance on the characteristics of the transistors 17 and 18 are not always necessary, the resistance 21 can be omitted.

FIG. 5 shows an equivalent circuit of the interconnection circuit shown in FIG. 4.

Compared with the circuit shown in FIG. 4, the equivalent circuit of FIG. 5 comprises a parasitic diode 25 equivalently connected in parallel to the transistor 14, a parasitic diode 24 equivalently connected in parallel to the transistor 18, and a parasitic capacitor 26 equivalently connected in parallel to the transistor 2. The parasitic diodes 25 and 24 are formed due to the structure of the MOS field effect transistors 14 and 18 and the mechanism of the formation of the parasitic diodes are the same as that of the parasitic diode 23 of the MOS filed effect transistor 4 shown in FIG. 3. The parasitic capacitor 26 is the gate capacitance of the transistor 2, which is omitted in the equivalent circuit of FIG. 2 and illustrated in FIG. 5 for the correctness of the description.

Referring to the equivalent circuit of FIG. 5, the operation for protecting the interconnection circuit will be carried out in the following manner when an input signal having overvoltage is applied to the circuit. The equivalent circuit of FIG. 5 comprises the parasitic diode 25 having the function of the diode 6 for the protection against the input overvoltage shown in FIG. 1. Therefore, when an overvoltage of the level lower than the ground $V_{ss}$ is applied to the input terminal 8, the parasitic diode 25 conducts and prevents the destruction of this circuits by the overvoltage. Meanwhile, when an overvoltage of the level higher than the power supply $V_{cc}$ is applied to the input terminal 8, the transistor 14 is subjected to the punch through state and the overvoltage escapes to the ground $V_{ss}$ through the transistor 14. The resistance 7 and the parasitic capacitor 26 have the same function for delaying the overvoltage applied to the input as described in relation to FIG. 1 also in the circuit of FIG. 5. By the above described operation, the transistor 14 prevents this interconnection circuit from being destroyed by the input overvoltage.

The operation when the power supply $V_{cc}$ of the interconnection circuit of FIG. 4 is turned off will be hereinafter described with reference to the equivalent circuit of FIG. 5.

In the equivalent circuit of FIG. 5, when the power supply $V_{cc}$ of the interconnection circuit is turned off, the first circuit 41 is in operation and the output thereof is brought to a high level voltage, there is no current flowing from the output of the first circuit 41 to the interconnection circuit since there is no current path such as the diode 5 shown in FIG. 1 between the input terminal 8 and the supply terminal 10. Therefore, the malfunction of the interconnection circuit due to the turning off of the power supply $V_{cc}$ of the interconnection circuit can be prevented.

Figure 2:
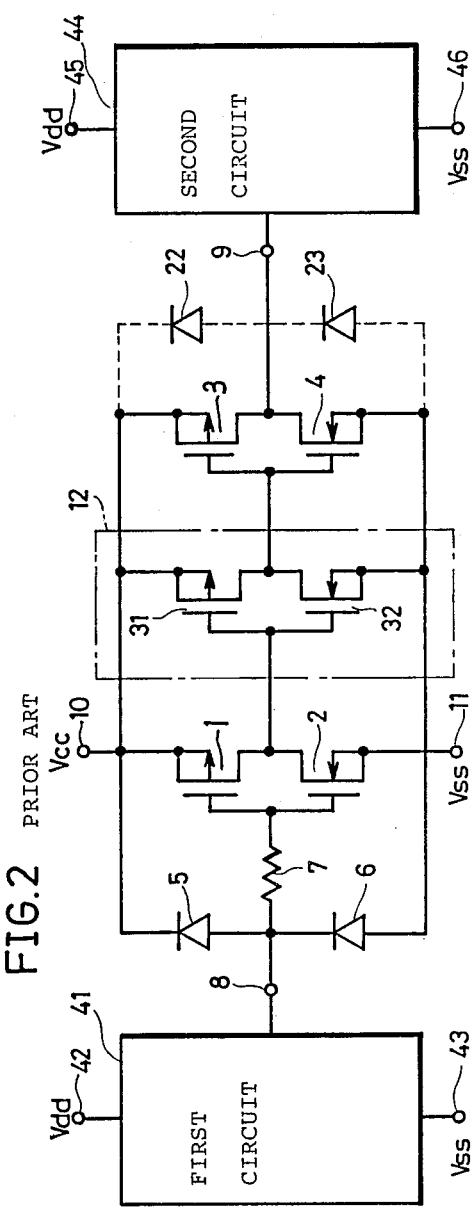
FIG. 2 is a schematic diagram of an equivalent circuit of the interconnection circuit shown in FIG. 1.

Meanwhile, when the power supply $V_{cc}$ of the interconnection circuit is turned off, the second circuit 44 is in operation and the output thereof is brought to a high level voltage, there is no current flowing from the output of the second circuit 44 to the interconnection circuit, since there is no current path such as the parasitic diode 22 shown in FIG. 2 formed on the transistor 17 and no current flows from the emitter (output terminal 9) of the npn bipolar transistor 17 to the base and the collector. Therefore, the malfunction of the interconnection circuit 44 due to the turning off of the power supply $V_{cc}$ of the interconnection circuit can be prevented.

Although the one example of the interconnection circuit shown in FIG. 4 comprises a CMOS integrated circuit, this may comprise an NMOS or a PMOS integrated circuit instead of the CMOS integrated circuit.

Although the interconnection circuit of FIG. 4 comprises the first CMOS inverter of the transistors 1 and 2 and the second CMOS inverter of the transistors 31 and 32, it is pointed out that these inverters are not essential to the present invention and they may be omitted. In that case, one terminal of the resistance 7 is directly connected to the third CMOS inverter of the transistors 15 and 16 and the inverted input signal is outputted from the output terminal 9.

It is also pointed out that the above described interconnection circuit are not always provided between one device and another device in the actual application. For example, one device can comprise the first circuit 41 and the interconnection circuit and can be connected to another device comprising the second circuit 44. In this case, the interconnection circuit serves as, in a sense, an output circuit of the former device. In another example, one device comprising the first circuit 41 can be connected to another device comprising the interconnection circuit and the second circuit 44. In this case, the interconnection circuit serves as the input circuit of the latter device. Such interconnection circuit is quite advantageous for the connection between the devices employing digital circuits, such as peripheral devices employed in the communication or the computer field.

As described above, the interconnection circuit in accordance with the present invention comprises ground connection means and delay means provided in the input stage, and inverter means and a series connection of an npn type bipolar transistor and an n type filed effect device provided in the output stage. The ground connection means and the delay means cooperate to protect this circuit from the destruction caused by the overvoltage applied to the input. When the power supply of the interconnection circuit is off, the inflow of the current into this circuit from the circuit connected to the input and the circuit connected to the output can be prevented, so that malfunctions caused by the inflow of the current from these circuits can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interconnection circuit connected between a first circuit (41) for applying an input signal and a second circuit (44) for outputting an output signal to the other circuits, comprising;

a power supply line to be connected to a power supply ($V_{cc}$), a ground line to be maintained at a ground level ($V_{ss}$)

an input (8) for receiving an input signal from said first circuit, ground connection means (14, 25) connected between said input (8) and said ground ($V_{ss}$) line and bringing said input (8) to the voltage of approximately the ground level ($V_{ss}$) when an overvoltage is applied to said input (8), processing means (1, 2, 12) connected between said power supply line and said ground line for processing the input signal applied to said input (8), delay means (7, 26) connected between said input (8) and said processing means (1, 2, 12) for applying the overvoltage applied to said input (8) to said processing means (1, 2, 12) with a delay, inverter means (15, 16) connected between said power supply line and said ground line for inverting the output signal of said processing means (1, 2, 12), a series connection between said power supply ($V_{cc}$) line and said ground ($V_{ss}$) line in which an npn type bipolar transistor (17) having a collector, an emitter and a base and an n type first field effect device (18) having a drain, a source and a gate connected in this order; wherein said base of said bipolar transistor (17) is connected to an output of said inverter means (15, 16), said collector is connected to receive a supply voltage from said power supply ($V_{cc}$) and said emitter is connected together with said drain of said first field effect device (18), and said gate of said first field effect device (18) is connected to the output of said processing means (1, 2, 12) and said source is connected to said ground line; and an output (9) constituted by the integral connection of said emitter of said bipolar transistor (17) and said drain of said first field effect device (18) for outputting an output signal.

2. An interconnection circuit according to claim 1, wherein said ground connection means comprises an n type second filed effect device (14) having a drain, a source and a gate, said drain of said second field effect device (14) is connected to said input (8), and said source and said gate of said second field effect device (14) are connected together to said ground line, and diode means connected between said input (8) and said ground line with such polarity that allows the current to flow from said ground line to said input (8).

3. An interconnection circuit according to claim 1, wherein said delay means comprises first resistance means (7) connected between said input (8) and said processing means (1, 2, 12), and
  capacitance means (26) connected between an input of said processing mean (1, 2, 12) and said ground line.

4. An interconnection circuit according to claim 2, wherein said source and drain of said second field effect device are formed in a substrate thereof, and further wherein said diode means comprises a parasitic diode (25) formed between said drain and said substrate of said second field effect device (14).

5. An interconnection circuit according to claim 1, wherein said series connection further comprises second resistance means (21) connected between said power supply ($V_{cc}$) and said collector of said bipolar transistor (17).

6. An interconnection circuit of claim 1, wherein said processing means (1, 2, 12) comprises means for transmitting an input signal to an input of said inverter means (15, 16) through said delay means (7, 26).

7. An interconnection circuit according to claim 1, wherein said first inverter means (15, 16) comprises an inverter (15, 16) having a complementary field effect device connected between said power supply line and said ground line.

8. An interconnection circuit of claim 1, wherein said processing means comprises a parallel connection of inverters (1, 2, 31, 32) connected between said power supply line and said ground line.

* * * * *